| (12) | United States Patent | (10) Patent No.: | US 8,570,097 B2 |
|---|---|---|---|
| | Yoon | (45) Date of Patent: | Oct. 29, 2013 |

(54) SEMICONDUCTOR INTEGRATED CIRCUIT

(75) Inventor: Sang-Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

(21) Appl. No.: 13/411,727

(22) Filed: Mar. 5, 2012

(65) Prior Publication Data

US 2013/0027121 A1    Jan. 31, 2013

(30) Foreign Application Priority Data

Jul. 26, 2011    (KR) ........................ 10-2011-0074188

(51) Int. Cl.
*G05F 1/10*    (2006.01)
(52) U.S. Cl.
USPC .......................................... 327/538; 327/545
(58) Field of Classification Search
USPC .................................. 327/536, 538, 540, 545
See application file for complete search history.

(56) References Cited

U.S. PATENT DOCUMENTS

| 5,455,794 | A  | * | 10/1995 | Javanifard et al. | ........ 365/185.18 |
| 6,737,906 | B2 | * | 5/2004  | Senda et al.      | ................... 327/535 |
| 6,949,953 | B2 | * | 9/2005  | Cioaca            | ............................ 326/88 |
| 7,782,120 | B2 | * | 8/2010  | Kim et al.        | ...................... 327/535 |

FOREIGN PATENT DOCUMENTS

| KR | 1019990060766 | 7/1999 |
| KR | 1020020007785 | 1/2002 |
| KR | 1020050101893 | 10/2005 |

* cited by examiner

*Primary Examiner* — Jeffrey Zweizig
(74) *Attorney, Agent, or Firm* — IP & T Group LLP

(57) ABSTRACT

A semiconductor integrated circuit includes a first pad configured to receive a first voltage, a second pad configured to receive a second voltage, an internal voltage generation circuit configured to generate a third voltage having the same voltage level as the first voltage in response to the second voltage during a test mode, and an internal circuit configured to perform a normal operation using the first voltage and the second voltage during a normal mode and perform a test operation using the second voltage and the third voltage during the test mode.

13 Claims, 4 Drawing Sheets

SEMICONDUCTOR INTEGRATED CIRCUIT

CROSS-REFERENCE TO RELATED APPLICATIONS

The present application claims priority of Korean Patent Application No. 10-2011-0074188, filed on Jul. 26, 2011, which is incorporated herein by reference in its entirety.

BACKGROUND

1. Field

Exemplary embodiments of the present invention relate to a semiconductor designing technology, and more particularly, to a semiconductor integrated circuit.

2. Description of the Related Art

A semiconductor integrated circuit in accordance with the technology of the present invention may include a semiconductor memory, such as a Dynamic Random Access Memory (DRAM).

FIG. 1 is a block view showing a conventional Double Data Rate 3 Dynamic Random Access Memory (DDR3 DRAM) device, which uses an external power supply voltage and an internal power supply voltage.

Referring to FIG. 1, the DDR3 DRAM device 10 includes a power supply voltage pad 12, a voltage booster 14, and an internal circuit 16. The power supply voltage pad 12 receives a power supply voltage VDD from the outside. The voltage booster 14 boosts the power supply voltage VDD applied through the power supply voltage pad 12 to generate a boosted voltage VPP whose voltage level is higher than that of the power supply voltage VDD. The internal circuit 16 performs assigned operations based on the power supply voltage VDD and the boosted voltage VPP.

FIG. 2 is a block view showing a conventional DDR4 DRAM device, which uses an external power supply voltage and an internal power supply voltage.

Referring to FIG. 2, the DDR4 DRAM device 20 includes a power supply voltage pad 22, a voltage booster pad 24, and an internal circuit 26. The power supply voltage pad 22 receives a power supply voltage VDD from the outside. The voltage booster pad 24 receives a boosted voltage VPP whose voltage level is higher than that of the power supply voltage VDD from the outside. The internal circuit 26 performs assigned operations based on the power supply voltage VDD and the boosted voltage VPP that are received through the power supply voltage pad 22 and the voltage booster pad 24. In short, the DDR4 DRAM device 20 may not include the voltage booster 14 for a normal operation, compared with the DDR3 DRAM device 10.

The DDR4 DRAM device 20, however, is to receive both the power supply voltage VDD and the boosted voltage VPP from the outside even in a test mode, just as in a normal mode. This is because the DDR4 DRAM device 20 does not include a voltage booster for generating the boosted voltage VPP. For this reason, a probe test device allocates channels to the power supply voltage pad 22 and the voltage booster pad 24 of the DDR4 DRAM device 20 in order to supply the power supply voltage VDD and the boosted voltage VPP in the test mode. The allocation of channels for those pads means electrical connection with the probe test device to receive a corresponding power supply and a signal from the probe test device. Since the DDR4 DRAM device 20 has an increased number of pads 22 and 24 to which channels are allocated, the number of DRAM devices to be tested simultaneously in the test mode is decreased. Therefore, production cost and time may increase to perform test operations.

SUMMARY

An embodiment of the present invention is directed to a semiconductor integrated circuit that includes a minimum number of pads to be allocated for channels during a test mode.

Another embodiment of the present invention is directed to a semiconductor integrated circuit that has a stabilized power supply in a normal mode while occupying a minimum area.

In accordance with an embodiment of the present invention, a semiconductor integrated circuit includes: a first pad configured to receive a first voltage; a second pad configured to receive a second voltage; an internal voltage generation circuit configured to generate a third voltage having the same voltage level as the first voltage in response to the second voltage during a test mode; and an internal circuit configured to perform a normal operation using the first voltage and the second voltage during a normal mode and perform a test operation using the second voltage and the third voltage during the test mode.

In accordance with another embodiment of the present invention, a semiconductor integrated circuit includes: a first pad configured to receive a first voltage; a second pad configured to receive a second voltage having a higher voltage level than the first voltage; an internal voltage generation circuit configured to generate a third voltage in response to the second voltage, wherein the third voltage has a lower voltage level than the first voltage during a normal mode and the same voltage level as the first voltage during a test mode; and an internal circuit configured to perform a normal operation suing the first voltage to the third voltage during the normal mode and perform a test operation using the second voltage and the third voltage during the test mode.

In accordance with further embodiment of the present invention, a semiconductor integrated circuit includes: a first pad configured to receive a first voltage in a normal mod of the semiconductor integrated circuit; a second pad configured to receive a second voltage in the normal mode and a test mode of the semiconductor integrated circuit; and an internal voltage generation circuit configured to generate a third voltage in response to the second voltage, wherein the third voltage has a lower voltage level than the first voltage during the normal mode and the same voltage level as the first voltage during the test mode.

DETAILED DESCRIPTION

Figure 1:
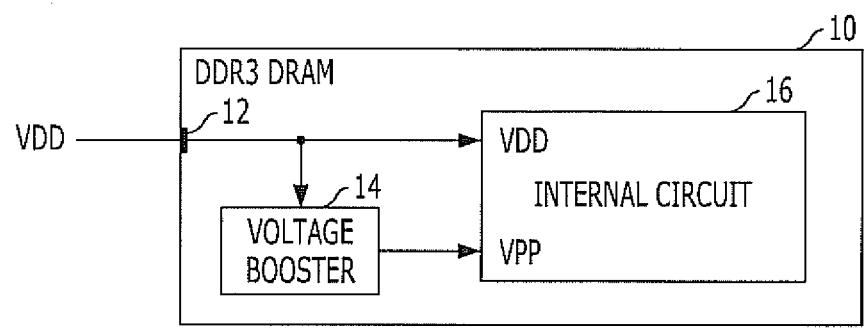
FIG. 1 is a block view of a conventional Double Data Rate 3 Dynamic Random Access Memory (DDR3 DRAM) device.
Figure 2:
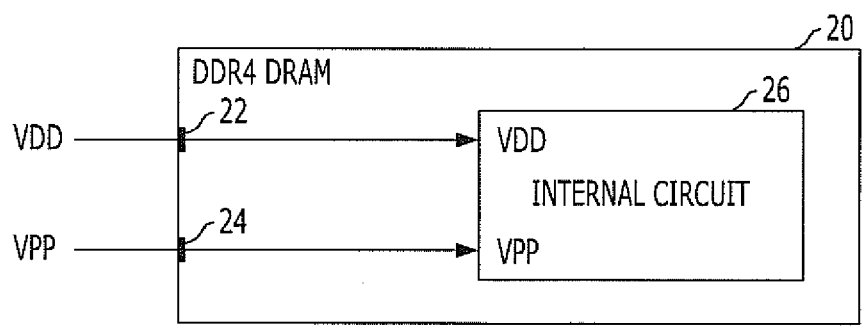
FIG. 2 is a block view of a conventional DDR4 DRAM device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following embodiments of the present invention, a Dynamic Random Access Memory (DRAM) device is described as an example.

Figure 3:
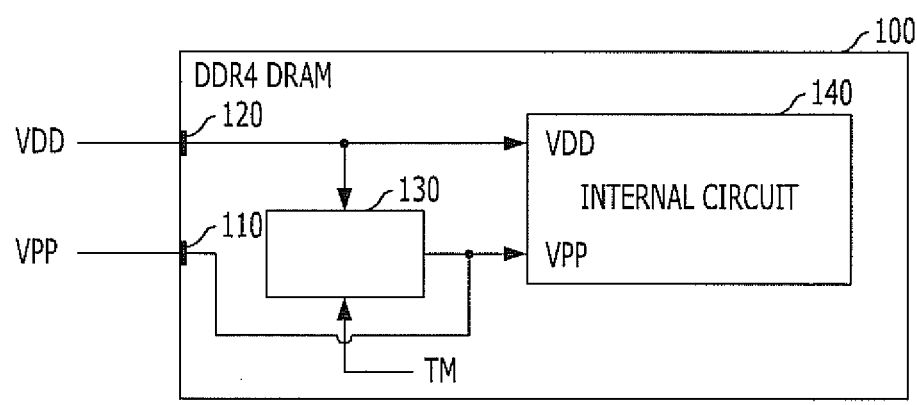
FIG. 3 is a block view of a DRAM device in accordance with a first embodiment of the present invention.

FIG. 3 is a block view of a DRAM device in accordance with a first embodiment of the present invention.

Referring to FIG. 3, a DRAM device 100 includes a boosted voltage pad 110, a power supply voltage pad 120, a boosted voltage generation circuit 130, and an internal circuit 140.

The boosted voltage pad 110 receives a boosted voltage VPP from the outside during a normal mode and does not receive the boosted voltage VPP during a test mode. The power supply voltage pad 120 receives a power supply voltage VDD from the outside in both the normal mode and the test mode. The boosted voltage generation circuit 130 generates a voltage VPP having the same voltage level as the boosted voltage VPP, that is applied from the outside through the boosted voltage pad 110 in the normal mode, by boosting the power supply voltage VDD in response to a test mode signal TM. The internal circuit 140 performs assigned operations by using the boosted voltage VPP and the power supply voltage VDD received through the boosted voltage pad 110 and the power supply voltage pad 120 in the normal mode and by using the power supply voltage VDD received through the power supply voltage pad 120 and the boosted voltage VPP that is generated by the boosted voltage generation circuit 130 in the test mode. The boosted voltage VPP has a higher voltage level than the power supply voltage VDD.

Described hereinafter is the operation of the DRAM device 100 in accordance with the first embodiment of the present invention having the above-described structure.

Since both the boosted voltage VPP and the power supply voltage VDD are all received from the outside in the normal mode, the internal circuit 140 performs assigned operations by directly receiving the boosted voltage VPP and the power supply voltage VDD through the boosted voltage pad 110 and the power supply voltage pad 120. In this state, since the test mode signal TM is deactivated, the boosted voltage generation circuit 130 is in a disabled state.

In the test mode, however, the power supply voltage VDD is applied to the power supply voltage pad 120 from the outside. Also, since the test mode signal TM is activated in the test mode, the boosted voltage generation circuit 130 is enabled to boost the power supply voltage VDD and generate the boosted voltage VPP. As a result, the internal circuit 140 performs assigned operations by using the power supply voltage VDD that is received through the power supply voltage pad 120 and the boosted voltage VPP that is generated in the boosted voltage generation circuit 130.

According to the first embodiment of the present invention described above, since test channels may not be allocated to pads for receiving the boosted voltage VPP during the test mode, the number of DRAM devices to be tested simultaneously may be increased.

Figure 4:
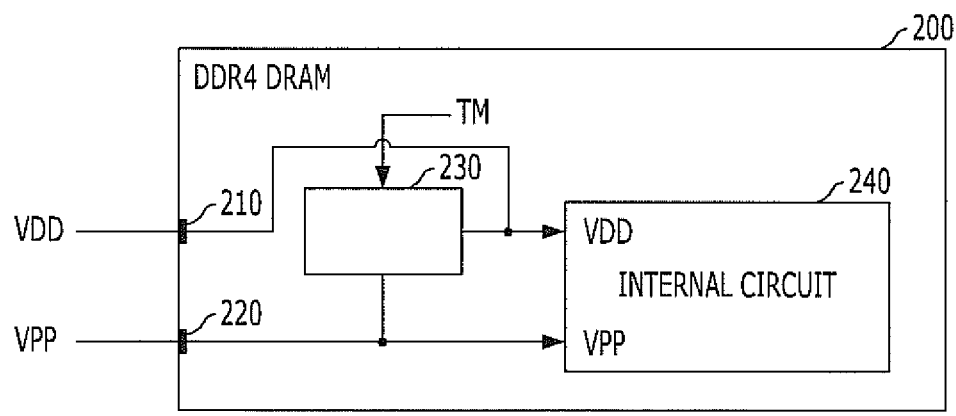
FIG. 4 is a block view of a DRAM device in accordance with a second embodiment of the present invention.
Figure 5:
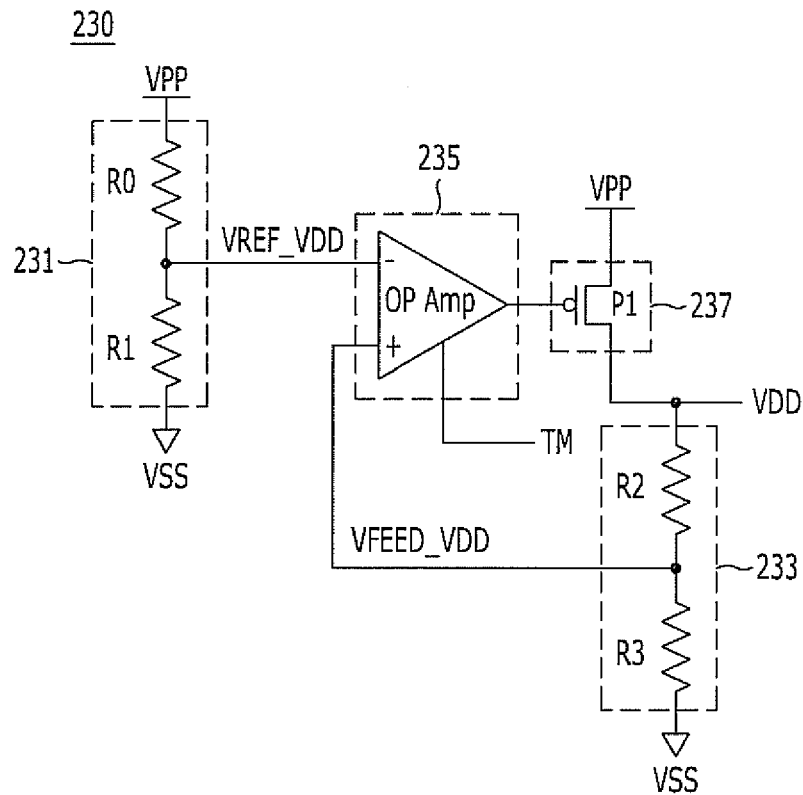
FIG. 5 is a block view illustrating a test power supply voltage generation circuit shown in FIG. 4.

FIG. 4 is a block view of a DRAM device in accordance with a second embodiment of the present invention. FIG. 5 is a block view illustrating a test power supply voltage generation circuit shown in FIG. 4.

The second embodiment of the present invention provides a DRAM device of a smaller area than that of the DRAM device according to the first embodiment. The boosted voltage generation circuit 130 of the DRAM device according to the first embodiment of the present invention may include a pumping circuit, and the pumping circuit generally has a feature of occupying a large area. On the other hand, the DRAM device according to the second embodiment of the present invention may adopt a down converter-type circuit, which is described below, instead of the pumping circuit, and the down converter-type circuit has a feature of occupying a smaller area than the pumping circuit according to the first embodiment.

Referring to FIG. 4, a DRAM device 200 includes a power supply voltage pad 210, a boosted voltage pad 220, a power supply voltage generation circuit 230, and an internal circuit 240.

The power supply voltage pad 210 receives a power supply voltage VDD from the outside during a normal mode and does not receive the power supply voltage VDD during a test mode. The boosted voltage pad 220 receives a boosted voltage VPP applied from the outside during both the normal mode and the test mode. The power supply voltage generation circuit 230 generates a voltage VDD having the same voltage level as the power supply voltage VDD, that is applied from the outside through the power supply voltage pad 210 during the normal mode, based on the boosted voltage VPP in response to a test mode signal TM. The internal circuit 240 performs assigned operations based on the power supply voltage VDD and the boosted voltage VPP that are received through the power supply voltage pad 210 and the boosted voltage pad 220 during the normal mode and performs assigned operations based on the boosted voltage VPP that is received through the boosted voltage pad 220 and the power supply voltage VDD that is generated in the test-purpose power supply voltage generation circuit 230 during the test mode. The boosted voltage VPP has a higher voltage level than the power supply voltage VDD.

Meanwhile, the power supply voltage generation circuit 230 includes a down-converter-type circuit, which is illustrated in FIG. 5. Referring to FIG. 5, the power supply voltage generation circuit 230 includes a first divider 231, a second divider 233, a comparator 235, and a driver 237.

The first divider 231 divides the boosted voltage VPP at a first division ratio to produce a reference voltage VREF_VDD. The second divider 233 divides the power supply voltage VDD at a second division ratio to produce a feedback voltage VFEED_VDD. The comparator 235 compares the reference voltage VREF_VDD with the feedback voltage VFEED_VDD in response to a test mode signal TM. The driver 237 drives a power supply voltage (VDD) terminal with the boosted voltage VPP in response to an output signal of the comparator 235.

In the power supply voltage generation circuit 230, the first divider 231 includes a first resistor R0 disposed between a boosted voltage (VPP) terminal and a reference voltage (VREF_VDD) terminal, and a second resistor R1 disposed between the reference voltage (VREF_VDD) terminal and a ground voltage (VSS) terminal.

The second divider 233 includes a third resistor R2 disposed between the power supply voltage (VDD) terminal and a feedback voltage (VFEED_VDD) terminal, and a fourth resistor R3 disposed between the feedback voltage (VFEED_VDD) terminal and the ground voltage (VSS) terminal.

Also, the comparator 235 includes a differential amplifier OP AMP and operates during a test mode in response to the test mode signal TM.

The driver 237 includes a PMOS transistor P1 which includes a gate for receiving an output signal of the comparator 235, and a source and a drain coupled between the boosted voltage (VPP) terminal and the power supply voltage (VDD) terminal.

Described hereinafter is the operation of the DRAM device 200 in accordance with the second embodiment of the present invention having the above-described structure.

Since both the boosted voltage VPP and the power supply voltage VDD are all received from the outside in the normal mode, the internal circuit 240 performs assigned operations by directly receiving the boosted voltage VPP and the power supply voltage VDD through the power supply voltage pad 210 and the boosted voltage pad 220. In this state, since the test mode signal TM is deactivated, the power supply voltage generation circuit 230 is in a disabled state.

In the test mode, however, the boosted voltage VPP is applied to the boosted voltage pad 220 from the outside during the test mode. Also, since the test mode signal TM is activated in the test mode, the power supply voltage generation circuit 230 is enabled to generate the power supply voltage VDD based on the boosted voltage VPP.

To describe the process of generating the power supply voltage VDD specifically, first, while the first divider 231 generates the reference voltage VREF_VDD by dividing the voltage applied between terminals of the boosted voltage VPP and the ground voltage VSS at the first division ratio, the comparator 235 continuously compares the feedback voltage VFEED_VDD with the reference voltage VREF_VDD to see if the feedback voltage VFEED_VDD is lower than the reference voltage VREF_VDD. As a result of the comparison, since the feedback voltage VFEED_VDD is lower than the reference voltage VREF_VDD, the comparator 235 outputs a comparison signal of a logic low level. The driver 237 drives the power supply voltage (VDD) terminal based on the boosted voltage VPP in response to the comparison signal.

The above-described operations of a series are repeated continuously until the feedback voltage VFEED_VDD becomes equal to the reference voltage VREF_VDD as the comparison result of the comparator 235, and then, the comparator 235 outputs a comparison signal of a logic high level. Accordingly, the driver 237 stops operating, and the power supply voltage (VDD) terminal maintains the target level, which is the level of the power supply voltage VDD.

The internal circuit 240 performs assigned operations by using the boosted voltage VPP that is received through the boosted voltage pad 220 and the power supply voltage VDD that is generated in the test-purpose power supply voltage generation circuit 230.

According to the second embodiment of the present invention described above, since test channels may not be allocated to pads for receiving the power supply voltage VDD during the test mode, the number of DRAM devices to be tested simultaneously may be increased, and moreover, the occupied area may be decreased, compared with that of the first embodiment of the present invention.

Figure 6:
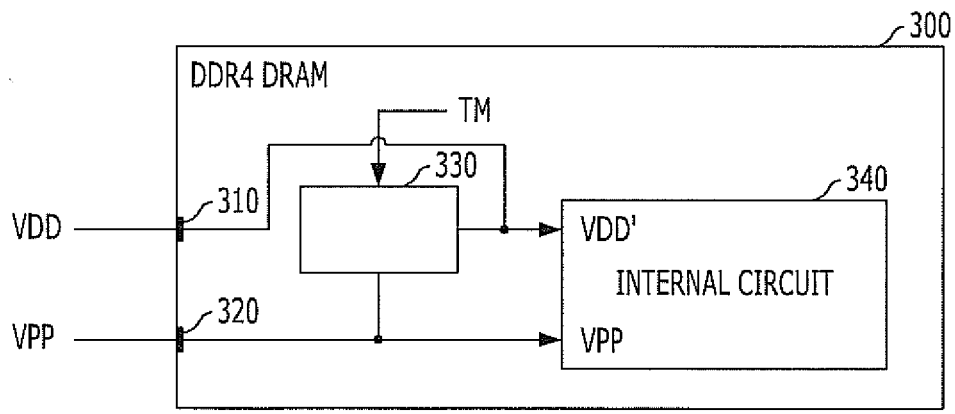
FIG. 6 is a block view of a DRAM device in accordance with a third embodiment of the present invention.
Figure 7:
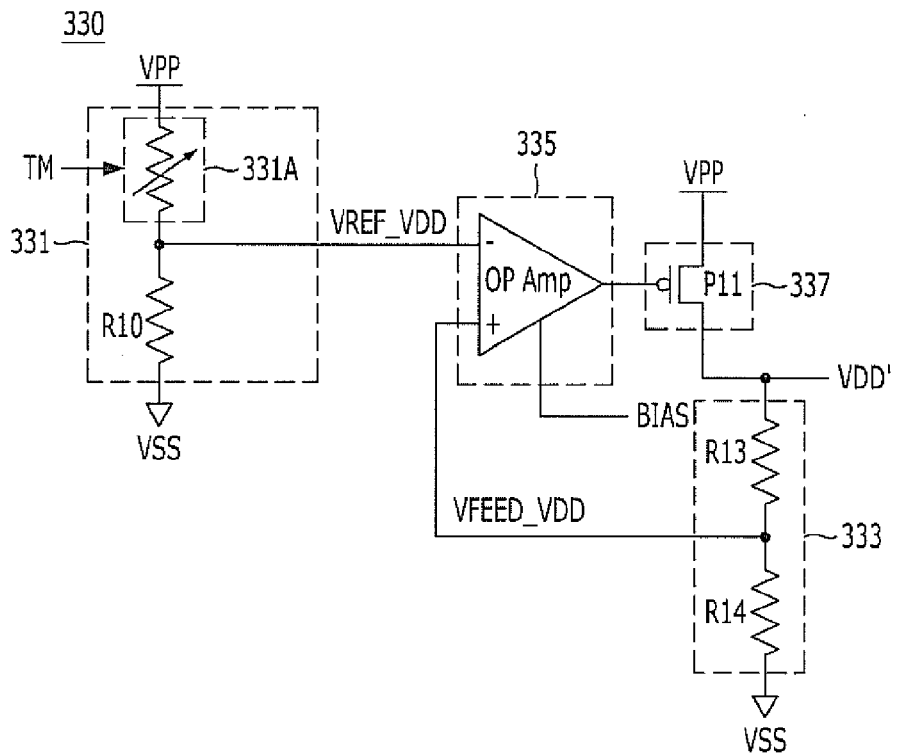
FIG. 7 is a block view illustrating a power supply voltage generation circuit shown in FIG. 6.
Figure 8:
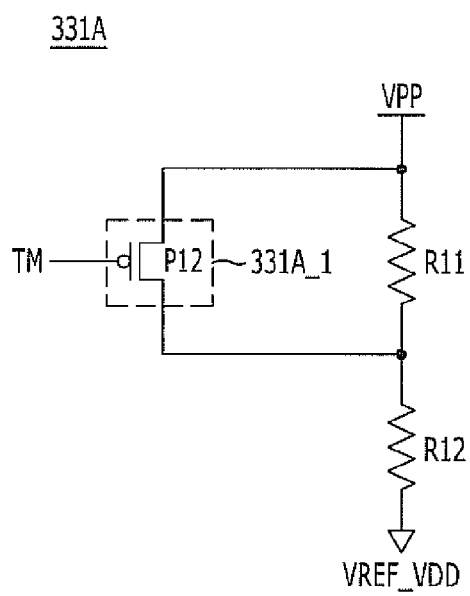
FIG. 8 is a block view illustrating a first variable resistor shown in FIG. 7.

FIG. 6 is a block view of a DRAM device 300 in accordance with a third embodiment of the present invention. FIG. 7 is a block view illustrating a power supply voltage generation circuit 330 shown in FIG. 6. FIG. 8 is a block view illustrating a first variable resistor 331 shown in FIG. 7.

Compared with the second embodiment of the present invention, the third embodiment of the present invention shows an example that the power supply voltage generation circuit operates in a normal mode but is used as a different function from the function in a test mode.

Referring to FIG. 6, the DRAM device 300 includes a power supply voltage pad 310, a boosted voltage pad 320, an internal voltage generation circuit 330, and an internal circuit 340.

The power supply voltage pad 310 receives a power supply voltage VDD from the outside during a normal mode and does not receive the power supply voltage VDD during a test mode. The boosted voltage pad 320 receives a boosted voltage VPP from the outside during the normal mode and the test mode. The internal voltage generation circuit 330 generates an internal voltage VDD' whose voltage level is lower than the voltage level of the power supply voltage VDD during the normal mode based on the boosted voltage VPP and generates the internal voltage VDD' of a voltage level corresponding to the power supply voltage VDD during the test mode based on the boosted voltage VPP. The internal circuit 340 performs assigned operations based on the power supply voltage VDD, the boosted voltage VPP, and the internal voltage VDD' during the normal mode and performs assigned operations based on the boosted voltage VPP and the internal voltage VDD' during the test mode. An internal voltage (VDD') terminal and a power supply voltage (VDD) terminal are electrically connected to each other.

Meanwhile, the internal voltage generation circuit 330 includes a down-converter-type circuit, which is illustrated in FIG. 7. Referring to FIG. 7, the internal voltage generation circuit 330 includes a first divider 331, a second divider 333, a comparator 335, and a driver 337. The first divider 331 divides the boosted voltage VPP at a first division ratio during the normal mode to produce a reference voltage VREF_VDD in response to a test mode signal TM and divides the boosted voltage VPP at a second division ratio during the test mode to produce a reference voltage VREF_VDD in response to the test mode signal TM. The second divider 333 divides the internal voltage VDD' at a third division ratio to produce a feedback voltage VFEED_VDD. The comparator 335 compares the reference voltage VREF_VDD with the feedback voltage VFEED_VDD. The driver 337 drives the internal voltage (VDD') terminal with the boosted voltage VPP in response to an output signal of the comparator 335.

In the internal voltage generation circuit 330, the first divider 331 includes a first variable resistor 331A disposed between a boosted voltage (VPP) terminal and a reference voltage (VREF_VDD) terminal and having a resistance value varying in response to the test mode signal TM, and a first resistor R10 disposed between the reference voltage (VREF_VDD) terminal and a ground voltage (VSS) terminal.

For reference, as illustrated in FIG. 8, the first variable resistor 331A includes a second resistor R11 and a third resistor R12, that are serially coupled between the boosted voltage (VPP) terminal and the reference voltage (VREF_VDD) terminal, and a bypass unit 331A_1 for serving as a bypass of the second resistor R11 in response to the test mode signal TM. The bypass unit 331A_1 includes a PMOS transistor P12 which includes a gate for receiving the test mode signal TM, and a source and a drain that are coupled with the boosted voltage (VPP) terminal and a node between the second and third resistors R11 and R12, respectively.

Referring back to FIG. 7, the second divider 333 includes a fourth resistor R13 disposed between the internal voltage (VDD') terminal and a feedback voltage (VFEED_VDD)

terminal, and a fifth resistor R14 disposed between the feedback voltage (VFEED_VDD) terminal and the ground voltage (VSS) terminal.

Also, the comparator 335 includes a differential amplifier OP AMP and operates during the normal mode and the test mode in response to a bias signal BIAS having a constant voltage level. The bias signal BIAS may be applied from the outside or it may be generated internally.

The driver 337 includes a PMOS transistor P11 which includes a gate for receiving an output signal of the comparator 335, and a source and a drain coupled between the boosted voltage (VPP) terminal and the internal voltage (VDD') terminal.

Described hereinafter is the operation of the DRAM device 300 in accordance with the second embodiment of the present invention having the above-described structure.

During the normal mode, since both the boosted voltage VPP and the power supply voltage VDD are received from the outside, the internal circuit 340 performs assigned operations by directly receiving the boosted voltage VPP and the power supply voltage VDD through the power supply voltage pad 310 and the boosted voltage pad 320. In this state, since the test mode signal TM is deactivated, the internal voltage generation circuit 330 operates to generate the internal voltage VDD' whose voltage level is lower than the voltage level of the power supply voltage VDD. To be more specific, the bypass unit 331A_1 is disabled in response to a deactivated test mode signal TM and accordingly, as the reference voltage VREF_VDD is set to 'VPP*R10/(R10+R11+R12)', the internal voltage generation circuit 330 comes to have a target voltage level lower than the level of the power supply voltage VDD for the internal voltage terminal (VDD'). Since the power supply voltage VDD is provided from the outside to the internal voltage (VDD') terminal, the internal voltage generation circuit 330 does not generate the internal voltage VDD'. In short, since the power supply voltage (VDD) terminal and the internal voltage (VDD') terminal are electrically connected, where the voltage level of the internal voltage (VDD') terminal is the same as the voltage level of the power supply voltage VDD, the feedback voltage VFEED_VDD is maintained to be higher than the reference voltage VREF_VDD all the times during the normal mode, an operation for driving the internal voltage (VDD') terminal is not performed while the voltage level of the power supply voltage VDD maintains a proper value.

Meanwhile, as the internal circuit 340 performs assigned operations, the power supply voltage VDD may be improperly dropped. In this case, the internal voltage generation circuit 330 operates to compensate for the voltage level of the power supply voltage (VDD) terminal. In other words, when the voltage level of the power supply voltage (VDD) terminal is drastically dropped, the voltage level of the internal voltage (VDD') terminal is dropped drastically. The feedback voltage VFEED_VDD is decreased lower than the reference voltage VREF_VDD corresponding to the extent of the drop. In this case, the driver 337 is enabled under the control of the comparator 335 to supply the boosted voltage VPP to the internal voltage (VDD') terminal.

Therefore, although the voltage level of the power supply voltage VDD is drastically dropped during the normal mode, the internal voltage generation circuit 330 compensates for the voltage level of the power supply voltage VDD so as to stabilize the power supply voltage VDD.

Meanwhile, the boosted voltage VPP is applied to the boosted voltage pad 320 during the test mode. Since the test mode signal TM is activated, the internal voltage generation circuit 330 generates the internal voltage VDD' based on the boosted voltage VPP. The process of generating the internal voltage VDD' is described in detail, hereinafter.

First, as the resistance value of the first variable resistor 331A varies to be low, the voltage level of the reference voltage VREF_VDD is set to be higher than the voltage level in the normal mode. In other words, the bypass unit 331A_1 is enabled in response to the activated test mode signal TM, and accordingly, the reference voltage VREF_VDD is set to 'VPP*R10/(R10+R12)'. The reason that the voltage level of the reference voltage VREF_VDD is increased is to make the internal voltage VDD' correspond to the power supply voltage VDD.

When the reference voltage VREF_VDD is set as above, the comparator 335 continuously compares the feedback voltage VFEED_VDD with the reference voltage VREF_VDD to see if the feedback voltage VFEED_VDD is lower than the reference voltage VREF_VDD. As a result of the comparison, since the feedback voltage VFEED_VDD becomes lower than the reference voltage VREF_VDD, the comparator 335 outputs a comparison signal of a logic low level. The driver 337 then drives the power supply voltage (VDD) terminal with the boosted voltage VPP. When the comparison result of the comparator 335 indicates that the feedback voltage VFEED_VDD is equal to the reference voltage VREF_VDD after repeating a series of the above operations, the comparator 335 outputs a comparison signal of a logic high level. The driver 337 then stops operating and as a result, the internal voltage (VDD') terminal maintains a target voltage level, which is the level of the power supply voltage VDD.

Therefore, the internal circuit 340 stably performs an operation based on the boosted voltage VPP which is applied through the boosted voltage pad 320 and the internal voltage VDD', whose voltage level is substantially the same as the power supply voltage VDD, generated in the internal voltage generation circuit 330.

Meanwhile, the boosted voltage VPP may be applied at a higher voltage level than a general voltage level during some initial period of the test mode in order to get better operation characteristics during the test mode. In this case, the internal voltage generation circuit 330 may secure an operation to generate the internal voltage VDD' at a voltage level corresponding to the voltage level of the power supply voltage VDD, and as the resistance varying of the first variable resistor 331A is completed, the operation of the internal voltage generation circuit 330 is maintained.

According to the third embodiment of the present invention, since test channels may not be allocated to pads for receiving the power supply voltage VDD during the test mode, the number of DRAM devices to be tested simultaneously may be increased. Also, the occupied area may be decreased, compared with that of the first embodiment of the present invention. Also, compared with the second embodiment of the present invention, the power supply voltage VDD may be stabilized by being supplemented with the boosted voltage VPP when the voltage level of the power supply voltage VDD is improperly decreased during the normal mode.

According to an embodiment of the present invention, an internal circuit directly receives both first voltage and second voltage from the outside and use them in a normal mode, and the internal circuit receives only a second voltage and internally generates a first voltage based on the received second voltage in a test mode. In other words, the number of voltages applied from the outside in the test mode may be reduced, compared with the number of voltages applied in the normal mode. Since the number of pads to which channels are allocated is decreased, the number of semiconductor integrated circuits to be tested simultaneously is increased, thus reducing production cost and production time.

Also, the occupied area may be minimized by adopting a down-converter-type circuit to internally produce a voltage during the test mode.

In addition, when the voltage level of the first voltage is improperly decreased in the normal mode, the first voltage may return to a stabilized level by supplementing it with the second voltage.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit comprising:
    a first pad configured to receive a first voltage;
    a second pad configured to receive a second voltage;
    an internal voltage generation circuit configured to generate a third voltage having the same voltage level as the first voltage in response to the second voltage during a test mode; and
    an internal circuit configured to perform a normal operation using the first voltage and the second voltage during a normal mode and perform a test operation using the second voltage and the third voltage during the test mode.

2. The semiconductor integrated circuit of claim 1, wherein the internal voltage generation circuit comprises a pumping circuit which generates the third voltage whose voltage level is higher than the second voltage in response to a test mode signal.

3. The semiconductor integrated circuit of claim 1, wherein the internal voltage generation circuit comprises a down converter-type circuit which generates the third voltage whose voltage level is lower than the second voltage in response to a test mode signal.

4. The semiconductor integrated circuit of claim 3, wherein the internal voltage generation circuit comprises:
    a first divider configured to generate a reference voltage by dividing the second voltage at a first division ratio;
    a second divider configured to generate a feedback voltage by dividing the third voltage at a second division ratio;
    a comparator configured to compare the feedback voltage with the reference voltage in response to the test mode signal; and
    a driver configured to supply a terminal of the third voltage with the second voltage in response to an output signal of the comparator.

5. A semiconductor integrated circuit comprising:
    a first pad configured to receive a first voltage;
    a second pad configured to receive a second voltage having a higher voltage level than the first voltage;
    an internal voltage generation circuit configured to generate a third voltage in response to the second voltage, wherein the third voltage has a lower voltage level than the first voltage during a normal mode and the same voltage level as the first voltage during a test mode; and
    an internal circuit configured to perform a normal operation using the first voltage to the third voltage during the normal mode and perform a test operation using the second voltage and the third voltage during the test mode.

6. The semiconductor integrated circuit of claim 5, wherein terminals of the first voltage and the third voltage are electrically connected to each other.

7. The semiconductor integrated circuit of claim 5, wherein the internal voltage generation circuit comprises:
    a first divider configured to generate a reference voltage in response to a test mode signal by dividing the second voltage at a first division ratio during the normal mode and at a second division ratio during the test mode;
    a second divider configured to generate a feedback voltage by dividing the third voltage at a third division ratio;
    a comparator configured to compare the feedback voltage with the reference voltage; and
    a driver configured to supply a terminal of the third voltage with the second voltage in response to an output signal of the comparator.

8. The semiconductor integrated circuit of claim 7, wherein the first divider comprises a variable resistor whose resistance varies in response to the test mode signal.

9. The semiconductor integrated circuit of claim 7, wherein the first divider comprises:
    a variable resistor disposed between terminals of the second voltage and the reference voltage, wherein a resistance value of the variable resistor is configured to vary in response to the test mode signal; and
    a first resistor disposed between the terminal of the reference voltage and a terminal of a ground voltage.

10. The semiconductor integrated circuit of claim 9, wherein the variable resistor comprises:
    a second resistor and a third resistor that are serially coupled between the terminals of the second voltage and the reference voltage; and
    a bypass unit disposed in parallel to the second resistor and configured to serve as a bypass of the second resistor in response to the test mode signal.

11. The semiconductor integrated circuit of claim 10, wherein the bypass unit comprises a transistor which includes a gate for receiving the test mode signal, and a source and a drain that are coupled with the terminal of the second voltage and a node between the second and third resistors, respectively.

12. A semiconductor integrated circuit comprising:
    a first pad configured to receive a first voltage in a normal mod of the semiconductor integrated circuit;
    a second pad configured to receive a second voltage in the normal mode and a test mode of the semiconductor integrated circuit; and
    an internal voltage generation circuit configured to generate a third voltage in response to the second voltage, wherein the third voltage has a lower voltage level than the first voltage during the normal mode and the same voltage level as the first voltage during the test mode.

13. The semiconductor integrated circuit of claim 12, wherein the internal voltage generation circuit is configured to supply the third voltage to compensate a drop in the first voltage during the normal mode.

* * * * *